United States Patent

Mizuno et al.

[11] Patent Number: 5,817,559
[45] Date of Patent: Oct. 6, 1998

[54] PRODUCTION METHOD FOR A SEMICONDUCTOR DEVICE

[75] Inventors: Bunji Mizuno, Nara; Kenji Okada; Ichirou Nakayama, both of Osaka, all of Japan

[73] Assignee: Matsushita Electric Industrial Co., Ltd., Osaka, Japan

[21] Appl. No.: 440,979

[22] Filed: May 15, 1995

[30] Foreign Application Priority Data

May 16, 1994 [JP] Japan ................................. 6-100860

[51] Int. Cl.⁶ .................................................. H01L 21/336
[52] U.S. Cl. ........................... 438/301; 438/308; 438/798
[58] Field of Search ........................... 117/103; 437/173, 437/40–41, 944; 438/487, 308, 301, 798

[56] References Cited

U.S. PATENT DOCUMENTS

| | | |
|---|---|---|
| 4,099,318 | 7/1978 | Cooper et al. . |
| 4,253,888 | 3/1981 | Kikuchi . |
| 4,451,969 | 6/1984 | Chaudhuri . |
| 4,509,451 | 4/1985 | Collins et al. ........................ 118/50.1 |
| 4,521,447 | 6/1985 | Ovshinsky et al. . |
| 4,569,855 | 2/1986 | Matsuda et al. ........................ 427/35 |
| 4,774,195 | 9/1988 | Beneking . |
| 4,870,030 | 9/1989 | Markunas et al. . |
| 4,916,088 | 4/1990 | Mooney et al. . |
| 4,918,028 | 4/1990 | Shirai ........................ 437/81 |
| 4,918,033 | 4/1990 | Bartha et al. . |
| 4,950,621 | 8/1990 | Irvine et al. ........................ 437/81 |
| 5,225,366 | 7/1993 | Yoder . |
| 5,314,570 | 5/1994 | Ikegaya et al. ........................ 117/103 |
| 5,492,861 | 2/1996 | Opower ........................ 437/173 |
| 5,508,227 | 4/1996 | Chan et al. ........................ 437/172 |

FOREIGN PATENT DOCUMENTS

| | | |
|---|---|---|
| 0194109 | 9/1986 | European Pat. Off. . |
| 0247714 | 1/1987 | European Pat. Off. . |
| 3-231465 | 2/1990 | Japan . |
| 3-263827 | 3/1990 | Japan . |
| 5-229894 | 9/1993 | Japan . |

Primary Examiner—John Niebling
Assistant Examiner—Richard A. Booth
Attorney, Agent, or Firm—McDermott, Will & Emery

[57] ABSTRACT

A P-type impurity layer, a silicon monocrystal film, a silicon oxide film and a crystal silicon film are successively formed on a semiconductor substrate by introducing appropriate functional gases on the semiconductor substrate, while irradiating the semiconductor substrate with ionizing radiation or light at a temperature lower than 250° C. After forming a photoresist on the crystal silicon film at a temperature lower than 250° C., the resultant semiconductor substrate is subjected to etching by using the photoresist as a mask, so as to form a gate electrode B out of the silicon oxide film and a gate insulating film out of the silicon oxide film. Then, the resultant semiconductor substrate is subjected to etching again by using the gate electrode as a mask, so as to form a channel region out of the P-type impurity layer. A source electrode and a drain electrode are formed on the respective sides of the gate electrode on the semiconductor substrate by introducing an appropriate functional gas, while irradiating the semiconductor substrate with ionizing radiation or light at a temperature lower than 250° C.

1 Claim, 9 Drawing Sheets

PRODUCTION METHOD FOR A SEMICONDUCTOR DEVICE

BACKGROUND OF THE INVENTION

The present invention relates to a production method for a semiconductor device. More particularly, it relates to a production method for a semiconductor device in which a film forming process, which is conventionally performed at a high temperature, can be performed at a low temperature not excluding approximately 250° C.

Figure 7:
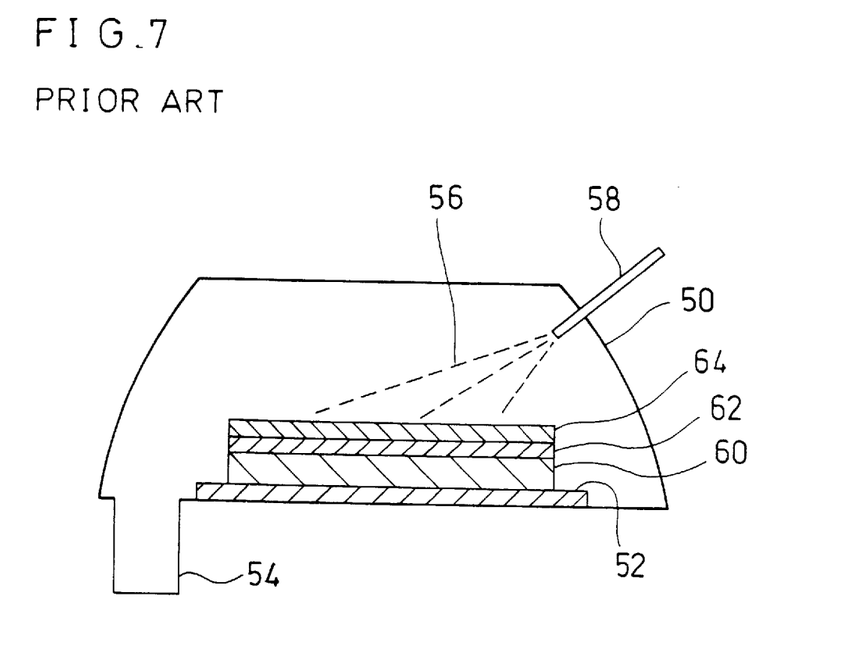
FIG. 7 is a sectional view of a conventional producing apparatus for a semiconductor device.

FIG. 7 is a schematic sectional view of a producing apparatus used in a conventional production method for a semiconductor device. As is shown in FIG. 7, this producing apparatus device comprises a chamber 50 that is retained to be vacuum, a substrate table 52 provided within the chamber 50 so as to place and support a semiconductor substrate thereon, an exhaust system 54 for exhausting a gas in the chamber 50, and an ion gun 58 for emitting desired ions 56 toward the substrate table 52.

Figure 8:
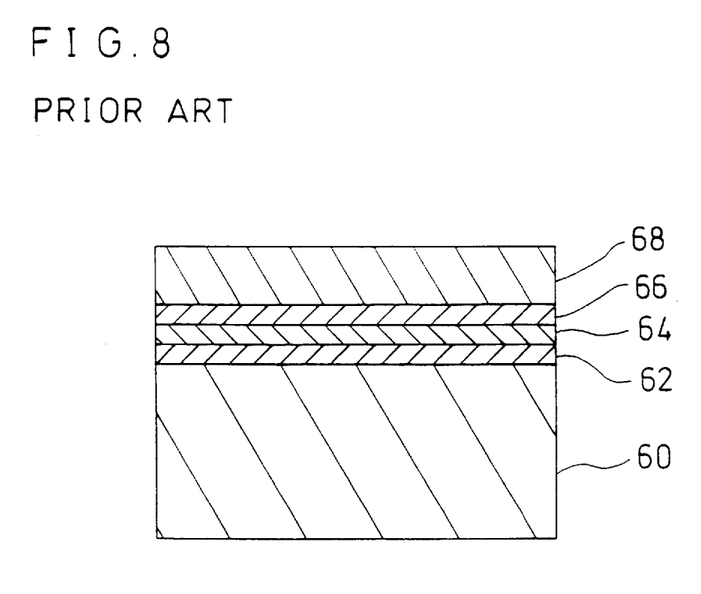
FIG. 8 is a sectional view showing a conventional production method for a semiconductor device.

The outline of the conventional production method for a semiconductor device, for example, a MOS transistor, will now be described referring to FIGS. 7 and 8.

First, the desired ions 56 are sprayed by the ion gun 58 onto the surface of a semiconductor substrate 60 made of, for example, silicon, that is supported on the substrate table 52, thereby forming a desired impurity layer 62 on the surface of the semiconductor substrate 60. Then, a silicon layer 64 is grown on the impurity layer 62.

Next, the resultant semiconductor substrate 60 is charged in an electric furnace (not shown), and is allowed to stand at a high temperature in a desired oxidation atmosphere. As a result, a silicon oxide film 66 is formed on the surface of the silicon layer 64. Then, the resultant semiconductor substrate 60 is charged in a CVD device (not shown), in which, for example, a gate electrode 68 is formed on the silicon oxide film 66. Thus, a MOS transistor is produced.

In the aforementioned conventional method, however, the semiconductor substrate 60 is exposed to a high temperature in forming the silicon oxide film 66 in the electric furnace. Therefore, the distribution such as a sharp distribution of the impurity layer 62 formed in the previous process can be disadvantageously degraded. This will be specifically described as follows: In producing a semiconductor device, a desired amount of a desired impurity is added to a desired portion of a semiconductor substrate made of, for example, pure silicon crystal, and then, the resultant semiconductor substrate is subjected to some treatments at a high temperature such as a process for epitaxially growing a crystal film.

Figure 9:
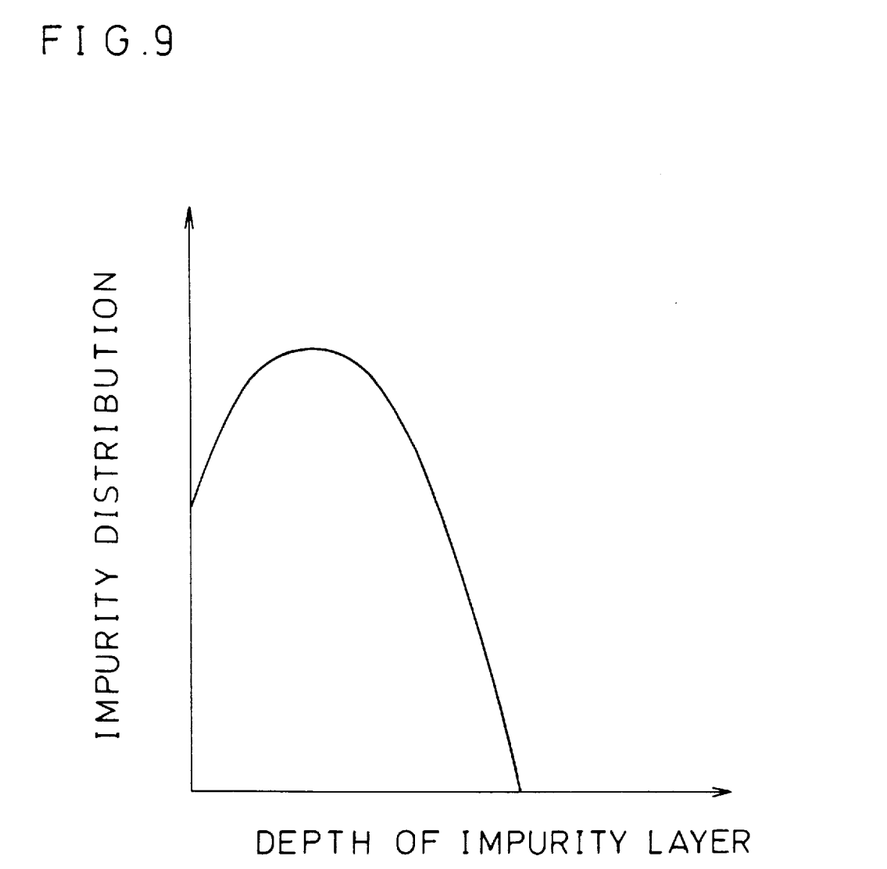
FIG. 9 is a diagram showing an impurity distribution in the direction of the depth of an impurity layer formed on a semiconductor substrate.

FIG. 9 shows a sharp distribution of an impurity in the direction of the depth of an impurity layer formed on a semiconductor substrate. Such a sharp distribution is required to be retained through the subsequent processes. When the treatment temperature in the subsequent film forming processes is high, however, the distribution of the impurity once settled is changed, resulting in a problem of spoiling the sharp distribution of the impurity.

When the treatment temperature in the subsequent film forming processes is decreased, another problem arises that a satisfactory film cannot be formed.

Further, besides the change of the distribution in the impurity layer, a high temperature at the film forming processes causes still another problem that the distribution of, for example, a compound layer such as an oxide layer, a nitride layer and a carbide layer formed in a previous process can be adversely affected.

SUMMARY OF THE INVENTION

Taking the aforementioned conventional problems into consideration, the objective of the invention is realizing a film forming process at a low temperature, which has been conventionally performed at a high temperature.

The first production method for a semiconductor device according to this invention was attained as a result of finding that a satisfactory film, which has been conventionally formed at a high temperature, can be formed at a low temperature by introducing a functional gas with irradiation by ionizing radiation or light.

The first production method for a semiconductor device comprises a step of forming a film on a semiconductor substrate having an impurity layer by introducing a functional gas on the semiconductor substrate while irradiating the semiconductor substrate with ionizing radiation or light at a temperature lower than 250° C.

When the functional gas is introduced while irradiating the semiconductor substrate with ionizing radiation or light, the functional gas is reacted with the main component of the semiconductor substrate at a low temperature not exceeding 250° C. since the functional gas is provided with energy by the ionizing radiation or light.

Further, since the film is formed at a low temperature not exceeding 250° C., the semiconductor substrate is not exposed to a high temperature, and hence, the formation of the film does not affect the distribution of the impurity in the semiconductor substrate.

Accordingly, a satisfactory film can be formed on a semiconductor substrate without affecting the distribution of the impurity in the semiconductor substrate.

In the first production method for a semiconductor device, the step of forming the film can include a step of forming a patterned film on the semiconductor substrate by exposing the semiconductor substrate with electron beams while introducing a functional gas on the semiconductor substrate.

In this case, the functional gas is reacted with the main component of the semiconductor substrate merely in an area that is exposed with the electron beams. Therefore, the patterned film can be formed on the semiconductor substrate without conducting etching. In this manner, a finely controlled pattern can be formed on a semiconductor substrate.

The second production method for a semiconductor device according to this invention comprises a step of forming a layer on a semiconductor substrate from an atom or a molecule different from the main component of the semiconductor substrate by introducing a functional gas while irradiating the semiconductor substrate with ionizing radiation or light at a temperature not exceeding 250° C.

When the functional gas is introduced while irradiating the semiconductor substrate with the ionizing radiation or light, the functional gas is reacted with the main component of the semiconductor substrate even at a low temperature not exceeding 250° C. since the functional gas is provided with energy by the ionizing radiation or light. Therefore, a layer can be satisfactorily formed from an atom or a molecule different from the main component of the semiconductor substrate.

Further, since the layer is formed at a low temperature not exceeding 250° C., the semiconductor substrate is not exposed to a high temperature, and hence, the component of the functional gas cannot be easily diffused in the semiconductor substrate. As a result, the layer can be formed without affecting the crystal structure of the semiconductor substrate.

Accordingly, it is possible to form an excellent layer on a semiconductor substrate from an atom or a molecule different from the main component of the semiconductor substrate without affecting the crystal structure of the semiconductor substrate.

In the second production method for a semiconductor device, the step of forming the layer can include a step of forming a patterned layer on the semiconductor substrate by exposing the semiconductor substrate with electron beams while introducing a functional gas on the semiconductor substrate.

In this manner, a patterned layer can be formed on a semiconductor substrate without conducting etching, and hence, it is possible to form a finely controlled pattern on a semiconductor substrate.

The third production method for a semiconductor device according to this invention is attained by applying the above-mentioned finding to a production method for a MOS transistor. This method comprises the steps of forming an impurity layer to be formed into a channel region on a semiconductor substrate by introducing a functional gas while irradiating the semiconductor substrate with ionizing radiation or light at a temperature not exceeding 250° C.; forming a semiconductor layer to be formed into a depth controlling layer of the impurity layer by introducing a functional gas while irradiating the semiconductor substrate with ionizing radiation or light at a temperature not exceeding 250° C.; forming an insulating layer to be formed into a gate insulating film on the impurity layer by introducing a functional gas while irradiating the semiconductor substrate with ionizing radiation or light at a temperature not exceeding 250° C.; forming a conductive layer to be formed into a gate electrode on the insulating layer by introducing a functional gas while irradiating the semiconductor substrate with ionizing radiation or light at a temperature not exceeding 250° C.; forming a resist pattern on the conductive layer so as to cover an area where the gate electrode is to be formed at a temperature not exceeding 250° C.; forming the gate electrode out of the conductive layer and the gate insulating film out of the insulating layer by etching the conductive layer by using the resist pattern as a mask at a temperature not exceeding 250° C.; forming the channel region out of the impurity layer by etching the impurity layer by using the gate electrode as a mask at a temperature not exceeding 250° C.; and forming a source electrode and a drain electrode on both the sides of the channel region on the semiconductor substrate by introducing a functional gas while irradiating the semiconductor substrate with ionizing radiation or light at a temperature not exceeding 250° C.

In this manner, all the steps of forming the impurity layer to be formed into the channel region, forming the insulating layer to be formed into the gate insulating film, forming the conductive layer to be formed into the gate electrode, forming the resist pattern, forming the gate electrode and the gate insulating film, forming the channel region and forming the source electrode and the drain electrode are conducted at a low temperature not exceeding 250° C. Accordingly, the impurity layer, the insulating layer and the conductive layer can be formed without affecting the distribution of the impurities in the respective layers. This leads to the formation of the elements of a MOS transistor, i.e., the channel region formed out of the impurity layer, the gate insulating film formed out of the insulating layer and the gate electrode formed out of the conductive layer, without affecting the distribution of the impurities in the respective elements. As a result, a MOS transistor accurately controlled as is designed can be manufactured.

The fourth production method for a semiconductor device according to this invention was attained as a result of finding that an epitaxially grown film can be satisfactorily formed even at a low temperature by allowing the film to be epitaxially grown while irradiating with ionizing radiation or light.

The fourth production method for a semiconductor device comprises the steps of forming a resist pattern on a semiconductor substrate, forming an epitaxially grown film on the semiconductor substrate by introducing a functional gas while irradiating the semiconductor substrate with ionizing radiation or light at a temperature not exceeding 250° C., and forming a patterned grown film out of the epitaxially grown film by removing the resist pattern.

When the functional gas is introduced while irradiating the semiconductor substrate with ionizing radiation or light, the film can be epitaxially grown even at a low temperature not exceeding 250° C. since the functional gas is provided with energy by the ionizing radiation or light. Therefore, an epitaxially grown film can be formed without damaging a resist pattern. This enables a film to be epitaxially grown merely in a desired area on a semiconductor substrate, which has been conventionally impossible.

In the fourth production method for a semiconductor device, it is preferable that the step of forming the epitaxially grown film includes a step of forming the epitaxially grown film by a blanket growing method which grows the continuous layer including the epitaxial layer on the surface of the substrate, and that the step of forming the patterned grown film includes a step of forming the patterned grown film in an area bearing no resist pattern by removing the resist pattern so as to remove a deposit thereon.

When a resist pattern is removed after forming the epitaxially grown film by the blanket growing method, a patterned grown film can be formed merely in an area on the semiconductor substrate bearing no resist pattern because a deposit attached to the resist pattern is also removed.

In the fourth production method for a semiconductor device, the step of forming the epitaxially grown film preferably includes a step of forming the epitaxially grown film in an area bearing no resist pattern by a selective growing method.

When a film is epitaxially grown by the selective growing method, it is possible to form an epitaxially grown film merely in an area bearing no resist pattern. Therefore, a step of removing the deposit on the resist pattern is not required.

DESCRIPTION OF THE PREFERRED EMBODIMENTS

Figure 1:
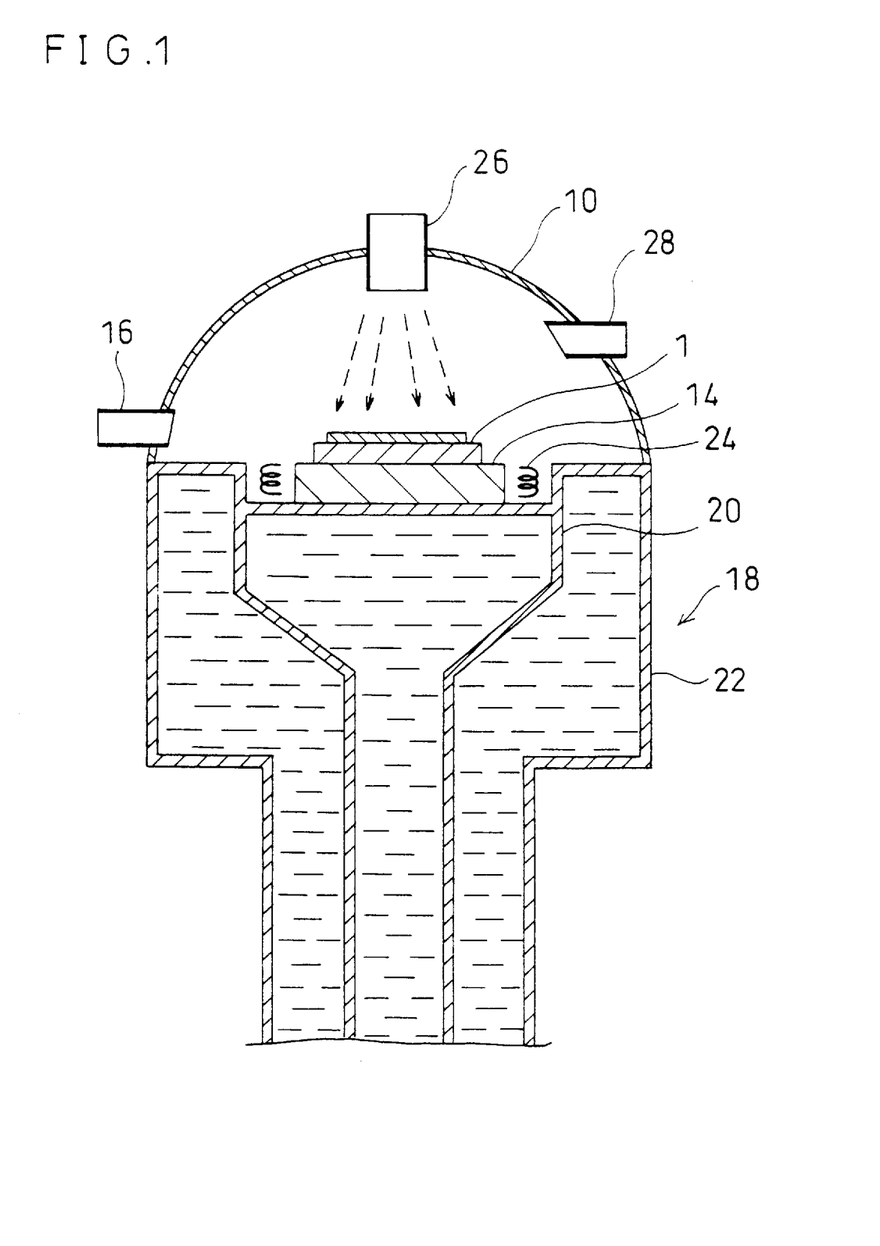
FIG. 1 is a sectional view of a producing apparatus for a semiconductor device used in each embodiment of the invention.

FIG. 1 shows the sectional structure of a producing apparatus used in each embodiment of the invention. As is shown in FIG. 1, the producing apparatus comprises a chamber 10 that is made of stainless steel or a glass material and is retained to be vacuum, a substrate table 14 that is provided within the chamber 10 for placing and supporting a semiconductor substrate 1 thereon, and an exhaust system 16 for exhausting a gas in the chamber 10. The exhaust system 16 is used also for attaining a vacuum state in the chamber 10 so as to keep the semiconductor substrate 1 placed on the substrate table 14 at a low temperature.

In FIG. 1, a temperature controller 18 controls the temperature of the semiconductor substrate 1 on the substrate table 14 within the range between a low temperature (i.e., a temperature of approximately 250° C. or lower) and a very low temperature (i.e., a temperature of approximately −269° C. or lower). The temperature controller 28 comprises a helium storage vessel 20 that is provided directly not exceeding the substrate table 14 and stores liquid helium for cooling the substrate table 14, a nitrogen storage vessel 22 that is provided around the helium storage vessel 20 and stores liquid nitrogen for isolating the helium storage vessel 20 from the external heat, and a heater 24 for heating the substrate table 14. The top portion of the helium storage vessel 20 is made of a good head conductor such as indium so as to attain good heat conductance.

Further, the chamber 10 is provided with an ionizing radiation inlet 26 for introducing, into the chamber 10, ionizing radiation or light such as X rays, γ rays, beams (including infrared radiation, visible radiation, UV, vacuum UV and the like) and electron beams, and a gas inlet 28 for introducing various functional gasses into the chamber 10.

Now, a production method for a semiconductor device according to a first embodiment of the invention will be described referring to FIG. 1.

A semiconductor substrate 1 made of silicon monocrystal, in which an impurity layer with desired distribution has been formed by the conventional method, is placed on the substrate table 14 whose temperature is kept at a low temperature of approximately −170° C. At this point, the chamber 10 is evacuated to be $10^{-6}$ through $10^{-9}$ Torr.

A process for forming a desired film on the semiconductor substrate 1 bearing the impurity layer by using the aforementioned producing apparatus by a growing method or a depositing method will now be described.

As an example of this process, the case where a silicon monocrystal film is grown on the semiconductor substrate 1 made of silicon will be exemplified. While keeping the degree of vacuum in the chamber 10 at $10^{-9}$ Torr and the temperature of the substrate table 14 at approximately −170° C., $Si_2H_6$ serving as a functional gas is introduced through the gas inlet 28, and the semiconductor substrate 1 is irradiated with UV (having a wavelength of, for example, 185 nm) as the ionizing radiation. Thus, silicon is epitaxially grown on the semiconductor substrate 1 by a thickness of approximately 100 nm per minute. In this case, the degree of vacuum in the chamber 10, the temperature of the substrate table 14, the kind, the intensity and the like of the ionizing radiation or light can be appropriately varied depending upon the characteristic of the semiconductor substrate 1 and a desired extent of retaining the distribution in the impurity layer.

When a monocrystal film is epitaxially grown on the semiconductor substrate 1 at a low temperature of, for example, approximately −170° C. in this manner, the impurity in the semiconductor substrate 1 cannot be easily diffused in the semiconductor substrate 1. Therefore, the initial distribution such as a sharp distribution of the impurity in the impurity layer can be maintained.

As another example, the case where an oxide film is formed on the semiconductor substrate 1 made of silicon monocrystal will be exemplified. While keeping the degree of vacuum in the chamber 10 at $10^{-9}$ Torr and the temperature of the substrate table 14 at approximately −170° C., $O_2$, $N_2O$, a mixture of $O_2$ and $N_2O$ or $O_3$ serving as a functional gas is introduced through the gas inlet 28, and the semiconductor substrate 1 is irradiated with X rays having a wavelength of approximately 100 nm by synchrotron radiation at an intensity of 50 mW/cm$^2$.

As still another example, the case where a nitrogen film is formed on the semiconductor substrate 1 made of silicon will be exemplified. While keeping the degree of vacuum in the chamber 10 at $10^{-9}$ Torr and the temperature of the substrate table 14 at approximately −170° C., $N_2$ or $NH_4$ is introduced as a functional gas. In the case where a carbide film is formed on the semiconductor substrate 1 made of silicon, while keeping the degree of vacuum in the chamber 10 at $10^{-9}$ Torr and the temperature of the substrate table 14 at approximately −170° C., $CH_4$ or $C_2H_6$ is introduced as a functional gas.

As for the ionizing radiation or light, X rays can be replaced with γ rays, beams (such as infrared radiation, visible radiation, UV and vacuum UV) or electron beams to attain the same effect.

Now, a production method for a semiconductor device according to a second embodiment of the invention will be described.

For example, in producing a semiconductor device, it is required to form, on a semiconductor substrate made of pure semiconductor crystal, a film having a different composition from the main component of the semiconductor substrate, without affecting the crystal structure of the semiconductor substrate. This second embodiment provides a method for forming, on a semiconductor substrate, a film having a different composition from the main component of the semiconductor substrate, such as an impurity layer, an oxide film and an electrode, without affecting the crystal structure of the semiconductor substrate.

A semiconductor substrate 1 is placed on the substrate table 14 whose temperature is kept at a low temperature of approximately −170° C. While keeping the degree of vacuum in the chamber 10 at $10^{-6}$ through $10^{-9}$ Torr, a functional gas is introduced through the gas inlet 28 and the semiconductor substrate 1 is irradiated with ionizing radiation or light. In this manner, a film made of an atom or a molecule contained in the functional gas can be hetero-epitaxially grown on the semiconductor substrate 1. Thus, on a semiconductor substrate 1 is formed a film made of an atom or a molecule different from the main component of the semiconductor substrate 1. In this case, since the functional gas is introduced while irradiating the semiconductor substrate 1 with the ionizing radiation or light, the film made of the atom or the molecule contained in the functional gas can be epitaxially grown on the semiconductor substrate 1 although the semiconductor substrate 1 is kept at a low temperature of approximately −170° C. Further, since the epitaxial growth is effected at a low temperature, the atom or the molecule in the functional gas is not diffused in the semiconductor substrate 1. Accordingly, a film having a different composition from the main component of the semiconductor substrate 1 can be formed thereon without affecting the crystal structure of the semiconductor substrate 1.

As an example of this process, the case where an impurity layer made of boron is epitaxially grown on a semiconductor substrate 1 made of silicon monocrystal will be exemplified. While keeping the degree of vacuum in the chamber 10 at $10^{-9}$ Torr and the temperature of the substrate table 14 at approximately −170° C., $B_2H_6$ serving as a functional gas is introduced through the gas inlet 28, and the semiconductor substrate 1 is irradiated with UV (having a wavelength of, for example, 185 nm) as the ionizing radiation. In this case, the degree of vacuum in the chamber 10, the temperature of the substrate table 14, the kind, the intensity and the like of the ionizing radiation or light can be appropriately varied depending upon the characteristic of the semiconductor substrate 1 and a desired extent of retaining the distribution in the impurity layer.

In the aforementioned second embodiment, a film is formed on the entire surface of a semiconductor substrate. It is also possible to apply this invention to the formation of a mesh-like film on a semiconductor substrate.

When a mesh-like film is desired to be formed on a semiconductor substrate, while keeping the degree of vacuum in the chamber 10 at $10^{-9}$ Torr and the temperature of the substrate table 14 at approximately −170° C., a functional gas with a low concentration is introduced through the gas inlet 28 into the chamber 10. In this manner, a restricted amount of atoms or molecules are aligned on the semiconductor substrate 1. Therefore, the lattice configuration of the semiconductor substrate 1 is not densely covered but some lattice points are skipped, resulting in the formation of a mesh-like film on the semiconductor substrate 1.

Next, a process for epitaxially growing a film of semiconductor crystal on an impurity layer formed on the surface of a semiconductor substrate 1 without affecting the impurity layer will be described. Such a process is required in the production of a MOSFET and the like. When the treatment temperature in this process is decreased, it is possible to grow an epitaxial film on the semiconductor substrate 1 without affecting the crystal structure of the semiconductor substrate 1 and the distribution in the impurity layer formed thereon.

As an example of this process, the case where a silicon film made of silicone monocrystal is grown on an impurity layer formed on a semiconductor substrate 1 will be exemplified. While keeping the degree of vacuum in the chamber 10 at $10^{-9}$ Torr and the temperature of the substrate table 14 at approximately −170° C., $Si_2H_6$ serving as a functional gas is introduced through the gas inlet 28, and the semiconductor substrate 1 is irradiated with UV (with a wavelength of, for example, 185 nm) as the ionizing radiation. Thus, a silicon film made of silicon monocrystal is hetero-epitaxially grown on the impurity layer by a thickness of approximately 100 nm per minute. In this case, the degree of vacuum in the chamber 10, the temperature of the substrate table 14, the kind, the intensity and the like of the ionizing radiation or light can be appropriately varied depending upon the characteristic of the semiconductor substrate 1 and a desired extent of retaining the distribution in the impurity layer.

Next, a process for forming a silicon oxide film on the surface of a silicon film without affecting the crystal structure of a semiconductor substrate 1 and the distribution in an impurity layer formed thereon will be described.

While keeping the degree of vacuum in the chamber 10 at $10^{-9}$ Torr and the temperature of the substrate table 14 at is introduced through the gas inlet 28 as a functional gas, and the semiconductor substrate 1 is irradiated with X rays having a wavelength of approximately 100 nm by the synchrotron radiation at an intensity of 50 mW/cm$^2$.

Further, in the case where a silicon nitride film is desired to be formed on the impurity layer instead of the silicon oxide film, while keeping the degree of vacuum in the chamber 10 at $10^{-9}$ Torr and the temperature of the substrate table 14 at approximately −170° C., $N_2$ or $NH_4$ is introduced as a functional gas. A silicon carbide film can be also formed instead of the silicon oxide film in the same manner except that $CH_4$ or $C_2H_6$ is introduced as a functional gas.

As for the ionizing radiation or light, X rays can be replaced with γ rays, beams (such as infrared radiation, visible radiation, UV and vacuum UV) or electron beams to attain the same effect.

A production method for a semiconductor device according to a third embodiment of the invention will now be described. Through the application of the aforementioned first or second embodiment, various types of frontier devices such as a MOS transistor can be produced. This third embodiment provides a method for producing a MOS transistor without affecting the distribution in an impurity layer formed in a semiconductor substrate.

First, a semiconductor substrate 1 made of silicon monocrystal is placed on the substrate table 14 kept at a low temperature of approximately −170° C. In this case, the chamber 10 is evacuated to be $10^{-6}$ through $10^{-9}$ Torr.

Figure 2:
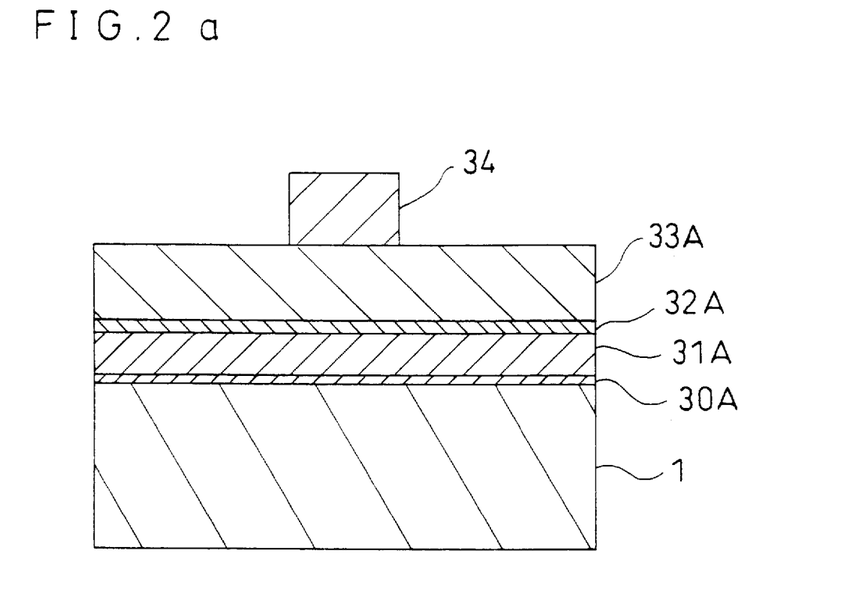
FIGS. 2(a) and 2(b) are sectional views of a semiconductor device in respective processes in a production method according to a third embodiment of the invention.

While keeping the degree of vacuum in the chamber 10 at $10^{-9}$ Torr and the temperature of the substrate table 14 at approximately −170° C., $B_2H_6$ serving as a functional gas is introduced through the gas inlet 28, and the semiconductor substrate 1 is irradiated with UV (having a wavelength of, for example, 185 nm) as the ionizing radiation. Thus, boron is hetero-epitaxially grown on the surface of the semiconductor substrate 1 so as to be formed into a P-type impurity layer 30A as is shown in FIG. 2(a).

Next, while keeping the degree of vacuum in the chamber 10 at $10^{-9}$ Torr and the temperature of the substrate table 14 at approximately −170° C., $Si_2H_6$ is introduced through the gas inlet 28 as a functional gas, and the semiconductor substrate 1 is irradiated with UV (having a wavelength of, for example, 185 nm) as the ionizing radiation. Thus, a silicon monocrystal film 31A is hetero-epitaxially grown on the P-type impurity layer 30A without affecting the configuration of the P-type impurity layer 30A.

Then, while keeping the degree of vacuum in the chamber 10 at $10^{-9}$ Torr and the temperature of the substrate table 14 at approximately −170° C., $O_2$, $N_2O$, a mixture of $O_2$ and $N_2O$ or $O_3$ is introduced as a functional gas through the gas inlet 28, and the semiconductor substrate 1 is irradiated with X rays having a wavelength of approximately 100 nm by the synchrotron radiation at an intensity of 50 mW/cm$^2$. In this manner, the silicon monocrystal film 31A is oxidized without affecting the configuration of the P-type impurity layer 30A, so as to form a silicon oxide film 32A on the surface of the silicon monocrystal film 31A. When a silicon nitride film is desired to be formed instead of the silicon oxide film 32A, $N_2$ or $NH_4$ is introduced as a functional gas, and when a silicon carbide film is desired to be formed, $CH_4$ or $C_2H_6$ is introduced as a functional gas. As for the ionizing radiation, X rays can be replaced with γ rays, beams (such as infrared radiation, visible radiation, UV and vacuum UV) or electron beams 110 to attain the same effect.

Then, while keeping the degree of vacuum in the chamber 10 at $10^{-9}$ Torr and the temperature of the substrate table 14 at approximately −170° C., $SiH_4$ is introduced through the gas inlet 28 as a functional gas, and the semiconductor substrate 1 is irradiated with UV (having a wavelength of, for example, 185 nm) as the ionizing radiation. In this manner, a crystal silicon film 33A is deposited on the silicon oxide film 32A.

Next, while keeping the degree of vacuum in the chamber 10 at $10^{-9}$ Torr and the temperature of the substrate table 14 at approximately −170° C., an impurity such as phosphorus (P) is ion-implanted in the crystal silicon film 33A, thereby making conductive the crystal silicon film 33A.

Figure 3:
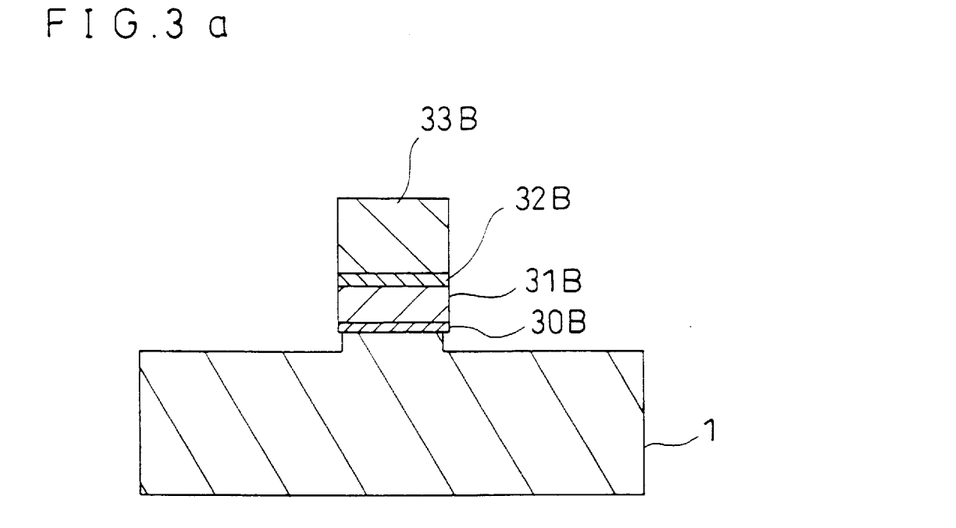
FIGS. 3(a) and 3(b) are sectional views of the semiconductor device in respective processes in the production method according to the third embodiment of the invention.

Then, while keeping the temperature of the substrate table 14 at approximately −170° C., a photoresist 34 is formed on the crystal silicon film 33A. The crystal silicon film 33A and the silicon oxide film 32A are then dry-etched by using the photoresist 34 as a mask. As a result, a gate electrode 33B and a gate insulating film 32B are formed as is shown in FIG. 2(b). After this, the silicon monocrystal film 31A and the P-type impurity layer 30A are subjected to the dry etching by using the gate electrode 33B as a mask, thereby forming an intrinsic layer 31B and a channel layer 30B as is shown in FIG. 3(a).

Next, while keeping the degree of vacuum in the chamber 10 at $10^{-9}$ Torr and the temperature of the substrate table 14 at approximately −170° C., $Si_2H_6$ is introduced through the gas inlet 28 as a functional gas, and the semiconductor substrate 1 is irradiated with UV (having a wavelength of, for example, 185 nm) as the ionizing radiation to grow a silicon monocrystal film. Then, $O_2$, $N_2O$, a mixture of $O_2$ and $N_2O$ or $O_3$ is introduced through the gas inlet 28 as a functional gas, and the semiconductor substrate 1 is irradiated with X rays having a wavelength of approximately 100 nm by the synchrotron radiation at an intensity of 50 mW/cm², so that the silicon monocrystal film be oxidized to be formed into a silicon oxide film. Then, the silicon oxide film is subjected to the dry etching, thereby forming a side wall 35 on both the side surfaces of the gate electrode 33B as is shown in FIG. 3(b).

Next, while keeping the degree of vacuum in the chamber 10 at $10^{-9}$ Torr and the temperature of the substrate table 14 at approximately −170° C., $SiH_4$ is introduced through the gas inlet 28 as a functional gas, and the semiconductor substrate 1 is irradiated with UV (having a wavelength of, for example, 185 nm) as the ionizing radiation, thereby depositing a crystal silicon film on the surface of the semiconductor substrate 1. After this, an impurity such as P is ion-implanted in the crystal silicon film so as to make conductive the crystal silicon film, thereby forming a source/drain electrode 36 as is shown in FIG. 3(b). In this manner, a MOS transistor is produced.

In the case where the source/drain electrode 36 is desired to be made from a metal film of aluminum including silicon or the like, while irradiating the semiconductor substrate with appropriate ionizing radiation or light at a low temperature, a gas including a desired metal element or the like (including vapor of a metal) is introduced.

As is described above, since a MOS transistor can be produced consistently at a low temperature in the third embodiment, it is possible to produce a highly accurate MOS transistor without affecting the configurations in the channel layer 30B formed out of the P-type impurity layer 30A, the gate insulating film 32B formed out of the silicon oxide film 32A and the gate electrode 33B formed out of the crystal silicon film 33A.

Now, production methods for a semiconductor device according to fourth and fifth embodiments of the invention will be described. Since a photosensitive photoresist generally has low heat resistance, it has been conventionally impossible to epitaxially grow a film on a semiconductor substrate by using a photoresist formed on the semiconductor substrate. However, when a film is epitaxially grown while irradiating with ionizing radiation or light, excellent epitaxial growth can be attained even at a low temperature of, for example, 250° C. or lower. In the following fourth embodiment, an epitaxial film is grown by a blanket growing method which grows the continuous layer including the epitaxial layer on the surface of the substrate, and in the following fifth embodiment, an epitaxial film is grown by a selective growing method.

First, a material for a photoresist used in the fourth and fifth embodiments will be described. The material includes, as a base, a novolak resin, a naphthoquinone resin, a phenol resin, a styrene resin, a styrene maleic acid resin, or a resin including polyallylsilesesquioxane, tetramethylammonium hydroxide and poly(p-hydroxybenzylsilesesquioxane), and further includes a photosensitive material mixed with the base.

Now, a production method for a semiconductor device according to the fourth embodiment of the invention will be described referring to FIGS. 4(a) through 4(d). In this embodiment, the degree of vacuum in the chamber 10, the temperature of the substrate table 14 and the kind of a functional gas introduced through the gas inlet 28 are basically the same as those in the aforementioned first to third embodiments, and hence, the description thereof is herein omitted.

Figure 4A:
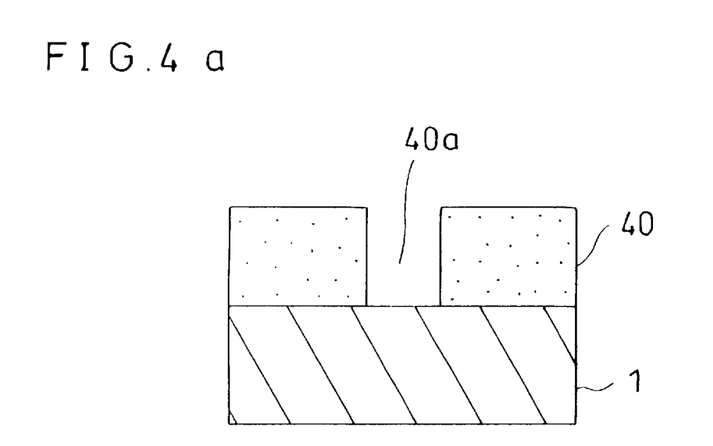
FIGS. 4(a) through 4(d) are sectional views of a semiconductor device in respective processes in a production method according to a fourth embodiment of the invention.

First, a photoresist 40 is formed, in vacuum and at a low temperature, on a semiconductor substrate 1 from the above-described photoresist material so as to have an aperture 40a at a desired area as is shown in FIG. 4(a).

Figure 4B:
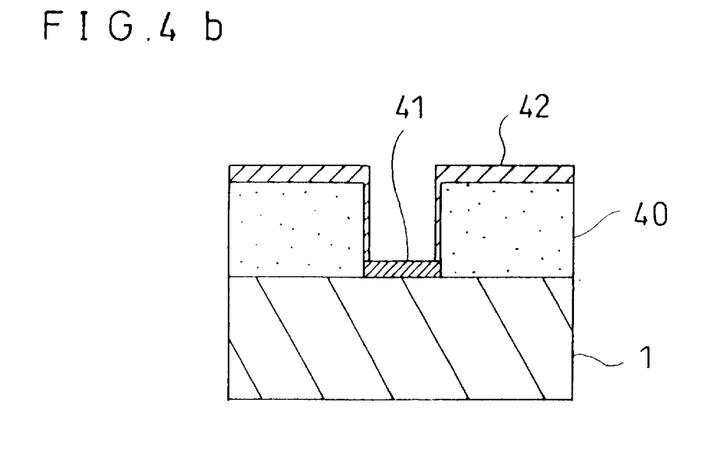

Next, while irradiating the semiconductor substrate 1 with the ionizing radiation or light in vacuum at a low temperature, a film is epitaxially grown on the semiconductor substrate 1 by the blanket growing method. As a result, an epitaxially grown film 41 of desired crystal is formed in an area on the semiconductor substrate 1 corresponding to the aperture 40a of the photoresist 40, but is not formed on the photoresist 40, to which a deposit 42 of a component contained in the used functional gas is adhered instead.

Figure 4C:
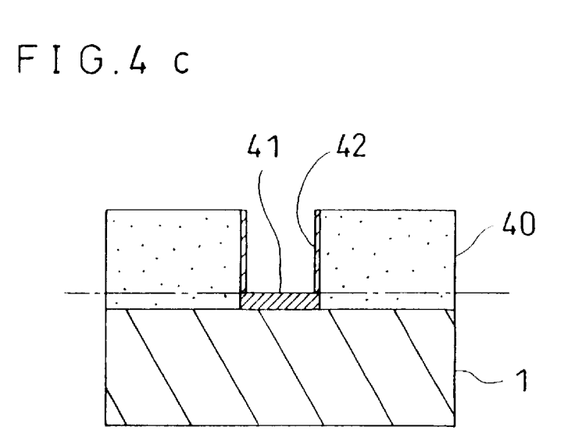
Figure 4D:
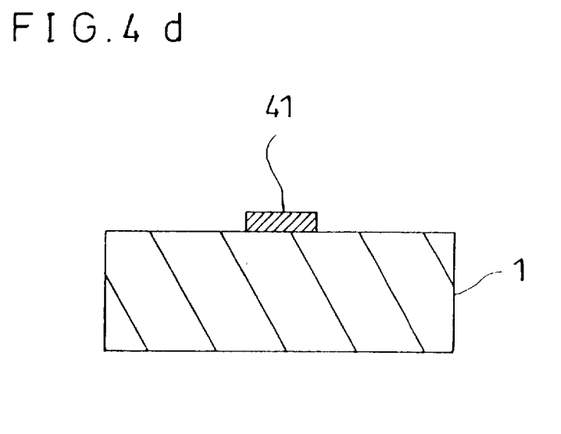

Then, the deposit 42 on the photoresist 40 is removed by chemical mechanical polishing (CMP). As a result, the photoresist 40 is exposed as is shown in FIG. 4(c), and the exposed photoresist 40 is ashed by, for example, oxygen plasma, to be removed. As a result, the epitaxially grown film 41 is remained on the semiconductor substrate I merely in the area corresponding to the aperture 40a of the photoresist 40 as is shown in FIG. 4(d). In this manner, the photoresist 40 is used as a mask in a selecting process in the fourth embodiment, resulting in selectively growing crystal at a low temperature.

When X rays or gamma rays are used as the ionizing radiation or light, it is preferable that a metal having an absorption edge corresponding to the irradiated energy is mixed in the resist material for exhibiting the mask effect.

Now, a production method for a semiconductor device according to the fifth embodiment of the invention will be described referring to FIGS. 5(a) through 5(c). Also in the fifth embodiment, the degree of vacuum in the chamber 10, the temperature of the substrate table 14 and the kind of a functional gas introduced through the gas inlet 28 are basically the same as those in the first to third embodiments, and hence, the description thereof is herein omitted.

Figure 5:
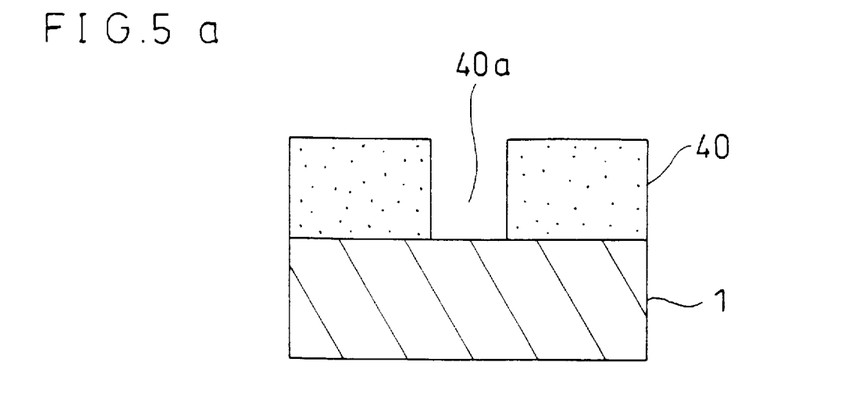
FIGS. 5(a) through 5(c) are sectional views of a semiconductor device in respective processes in a production method according to a fifth embodiment of the invention.

First, after forming a photoresist 40 on a semiconductor substrate 1 from the photoresist material so as to have an aperture 40a at a desired area as is shown in FIG. 5(a), a film is selectively epitaxially grown on the semiconductor substrate 1, while irradiating the semiconductor substrate 1 with the ionizing radiation or light in vacuum at a low temperature. As a result, an epitaxially grown film 41 of desired crystal is formed on the semiconductor substrate I merely in an area corresponding to the aperture 40a of the photoresist 40 as is shown in FIG. 5(b).

Next, the photoresist 40 is ashed by, for example, the oxygen plasma, to be removed, and the epitaxially grown film 41 is remained on the semiconductor substrate 1 merely in the area corresponding to the aperture 40a of the photoresist 40, as shown in FIG. 5(c). In this manner, the photoresist 40 is used as a mask in the selecting process in the fifth embodiment, thereby selectively growing crystal at a low temperature.

Now, a production method for a semiconductor device according to a sixth embodiment of the invention will be described referring to FIGS. 6(a) and 6(b).

Also in the sixth embodiment, the degree of vacuum in the chamber 10, the temperature of the substrate table 14 and the kind of a functional gas introduced through the gas inlet 28 are basically the same as those in the first to third embodiments, and hence, the description thereof is herein omitted.

Figure 6A:
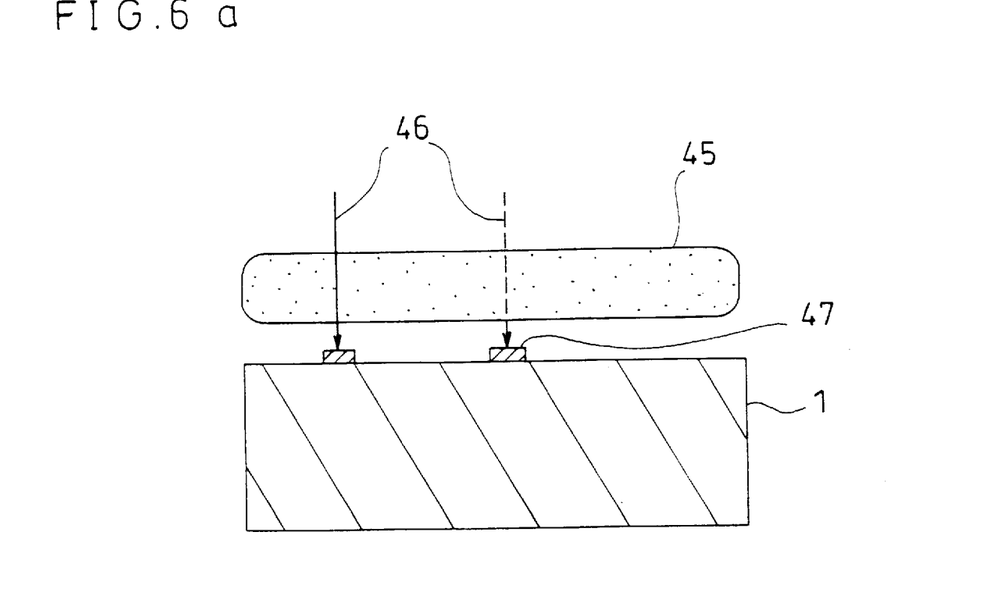
FIGS. 6(a) and 6(b) are a sectional view and a plan view of a semiconductor device in respective processes in a production method according to a sixth embodiment, respectively.
Figure 6B:
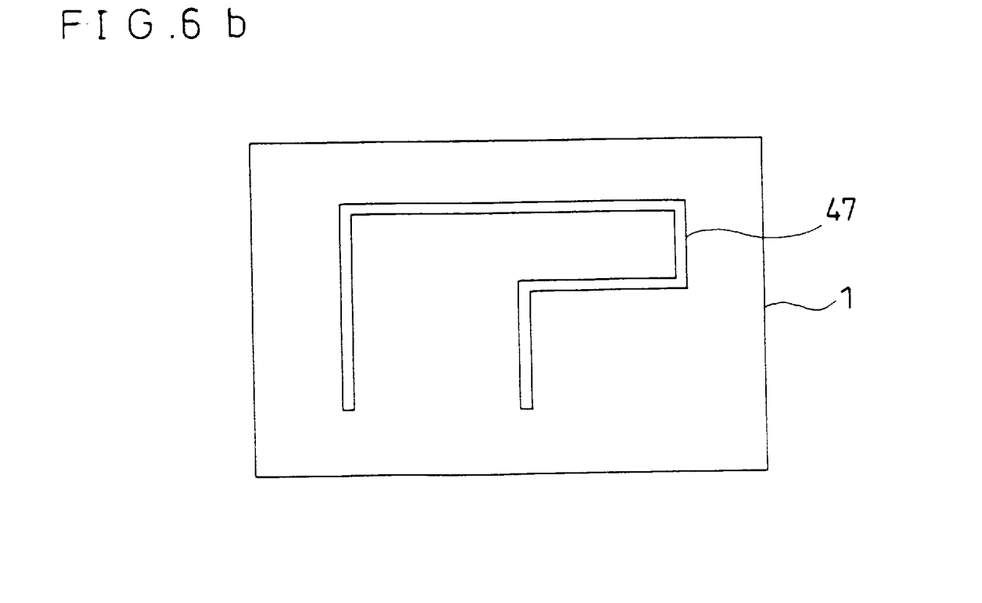

First, while irradiating a semiconductor substrate 1 with the ionizing radiation or light in vacuum at a low temperature, a functional gas 45 required for this process is introduced, and a desired area of the semiconductor substrate 1 in which an impurity layer, an oxide film or an electrode is to be formed is irradiated with electron beams 46 by using an EB emitter as is shown in FIG. 6(a). Thus, a reaction is effected between the material of the semiconductor substrate 1 and a component of the functional gas 45 merely in the area of the semiconductor substrate 1 irradiated with the electron beams 46, resulting in forming a desired pattern 47 for the impurity layer, the oxide film or the electrode as is shown in FIG. 6(b).

Since the semiconductor substrate 1 is locally excited by the electron beams 46 in the sixth embodiment, a film can be formed at a low temperature, in which the present invention is characterized.

We claim:

1. A production method for a semiconductor device comprising the step of:

forming an impurity layer to be formed into a channel region on a semiconductor substrate by introducing a functional gas on said semiconductor substrate, while irradiating said semiconductor substrate with ionizing radiation or light at a temperature not exceeding 250° C.;

forming a semiconductor layer to be formed into a depth controlling layer of said impurity layer by introducing a functional gas on said semiconductor substrate, while irradiating said semiconductor substrate with ionizing radiation or light at a temperature not exceeding 250° C.;

forming an insulating layer to be formed into a gate insulating film on said impurity layer by introducing a functional gas on said semiconductor substrate, while irradiating said semiconductor substrate with ionizing radiation or light at a temperature not exceeding 250° C.;

forming a conductive layer to be formed into a gate electrode on said insulating layer by introducing a functional gas on said semiconductor substrate, while irradiating said semiconductor substrate with ionizing radiation or light at a temperature not exceeding 250° C.;

forming a resist pattern on said conductive layer so as to cover an entire area where said gate electrode is to be formed at a temperature not exceeding 250° C.;

forming said gate electrode out of said conductive layer and said gate insulating film out of said insulating layer by etching said conductive layer by using said resist pattern as a mask at a temperature not exceeding 250° C.;

forming said channel region out of said impurity layer by etching said impurity layer by using said gate electrode as a mask at a temperature not exceeding 250° C.; and forming a source electrode and a drain electrode on both sides of said channel region by introducing a functional gas on said semiconductor substrate, while irradiating said semiconductor substrate with ionizing radiation or light at a temperature not exceeding 250° C.

* * * * *